United States Patent
Lin et al.

(10) Patent No.: US 11,515,341 B2
(45) Date of Patent: Nov. 29, 2022

(54) ARRAY SUBSTRATE, MANUFACTURING METHOD THEREOF, AND DISPLAY DEVICE

(71) Applicants: Fuzhou BOE Optoelectronics Technology Co., Ltd., Fuzhou (CN); BOE TECHNOLOGY GROUP CO., LTD., Beijing (CN)

(72) Inventors: Bin Lin, Beijing (CN); Yong Zeng, Beijing (CN); Yazhou Huo, Beijing (CN); Rong Wu, Beijing (CN); Zhouyu Chen, Beijing (CN); Liangliang Li, Beijing (CN)

(73) Assignees: FUZHOU BOE OPTOELECTRONICS TECHNOLOGY CO., LTD., Fujian (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 16/932,902

(22) Filed: Jul. 20, 2020

(65) Prior Publication Data
US 2021/0091122 A1 Mar. 25, 2021

(30) Foreign Application Priority Data
Sep. 25, 2019 (CN) .......................... 201910912462.3

(51) Int. Cl.
*H01L 27/12* (2006.01)
(52) U.S. Cl.
CPC ...... *H01L 27/1244* (2013.01); *H01L 27/1225* (2013.01); *H01L 27/1233* (2013.01);
(Continued)

(58) Field of Classification Search
CPC ............. H01L 27/1244; H01L 27/1233; H01L 27/1237; H01L 27/1251; H01L 27/1288;
(Continued)

(56) References Cited

U.S. PATENT DOCUMENTS

| 5,396,084 A | 3/1995 | Matsumoto |
| 2004/0188683 A1* | 9/2004 | Hotta ................... H01L 27/1237 257/59 |

(Continued)

FOREIGN PATENT DOCUMENTS

| CN | 104659285 A | 5/2015 |
| CN | 105489615 A | 4/2016 |

(Continued)

OTHER PUBLICATIONS

First Office Action for CN Patent Application No. 201910912462.3 dated Jun. 7, 2021.
(Continued)

*Primary Examiner* — Ahmed N Sefer
(74) *Attorney, Agent, or Firm* — Xsensus LLP

(57) ABSTRACT

The present application relates to the field of display technology and, in particular, to an array substrate, a manufacturing method of the array substrate, and a display device. An array substrate comprises: a base substrate having a pixel display area and a gate drive circuit area; a first thin film transistor formed in the pixel display area, the first thin film transistor comprising a first gate insulating layer; a second thin film transistor formed in the gate drive circuit area, the second thin film transistor comprising a second gate insulating layer, where a thickness of the second gate insulating layer is smaller than a thickness of the first gate insulating layer.

8 Claims, 3 Drawing Sheets

(52) U.S. Cl.
CPC ...... *H01L 27/1237* (2013.01); *H01L 27/1248* (2013.01); *H01L 27/1251* (2013.01); *H01L 27/1259* (2013.01); *H01L 27/1288* (2013.01)

(58) Field of Classification Search
CPC ............. H01L 27/1225; H01L 27/1248; H01L 27/1259
See application file for complete search history.

(56) References Cited

U.S. PATENT DOCUMENTS

| | | | | |
|---|---|---|---|---|
| 2006/0081852 | A1* | 4/2006 | Hotta | H01L 27/1233 257/72 |
| 2008/0179597 | A1* | 7/2008 | Yamazaki | H01L 27/12 257/59 |
| 2008/0203477 | A1* | 8/2008 | Yamazaki | H01L 27/1214 257/347 |
| 2008/0283837 | A1* | 11/2008 | Tanada | H01L 27/1237 257/59 |
| 2015/0008395 | A1* | 1/2015 | Yoon | H01L 27/1251 257/40 |
| 2016/0020230 | A1* | 1/2016 | Lee | H01L 27/1225 257/43 |
| 2016/0126303 | A1* | 5/2016 | Kwon | G09G 3/3233 257/40 |
| 2016/0163746 | A1* | 6/2016 | Ko | H01L 27/32 438/39 |
| 2016/0322402 | A1* | 11/2016 | Kim | H01L 27/1244 |
| 2017/0084636 | A1* | 3/2017 | Lin | H01L 27/1237 |
| 2017/0323906 | A1* | 11/2017 | Yamaguchi | H01L 27/1229 |
| 2017/0358610 | A1* | 12/2017 | Hanyu | H01L 27/1225 |
| 2018/0083076 | A1* | 3/2018 | Hanada | H01L 27/1248 |
| 2018/0219029 | A1* | 8/2018 | Hanyu | H01L 29/4908 |
| 2019/0081084 | A1* | 3/2019 | Xu | H01L 27/1229 |
| 2019/0204668 | A1* | 7/2019 | Yang | G09G 3/3258 |
| 2020/0152663 | A1* | 5/2020 | Li | H01L 27/1251 |
| 2020/0350341 | A1* | 11/2020 | Hanada | G09F 9/30 |
| 2021/0202648 | A1* | 7/2021 | Zhang | H01L 29/7869 |

FOREIGN PATENT DOCUMENTS

| | | |
|---|---|---|
| CN | 107302030 A | 10/2017 |
| CN | 109872998 A | 6/2019 |

OTHER PUBLICATIONS

Second Office Action for CN Patent Application No. 201910912462.3 dated Dec. 22, 2021.

* cited by examiner

ARRAY SUBSTRATE, MANUFACTURING METHOD THEREOF, AND DISPLAY DEVICE

CROSS-REFERENCE TO RELATED APPLICATION

The present application is based upon and claims priority to Chinese Patent Application No. 201910912462.3, filed on Sep. 25, 2019, the entire disclosure of which is hereby incorporated by reference as a part of the present application.

TECHNICAL FIELD

The present application relates to the field of display technology and, in particular, to an array substrate, a manufacturing method of the array substrate, and a display device.

BACKGROUND

Oxide semiconductor (e.g., indium gallium zinc oxide) may be used to form an active layer of a Thin Film Transistor (TFT) in existing array substrates. The oxide semiconductor has the characteristics of high mobility while being available in large-sized products.

It should be noted that the information disclosed in the above Background section is only used to enhance the understanding of the background of the present application, and therefore may include information that does not constitute prior art known to those of ordinary skill in the art.

SUMMARY

The present application provides an array substrate, a manufacturing method of the array substrate, and a display device.

In a first aspect of the present application, an array substrate is provided, including:

a base substrate having a pixel display area and a gate drive circuit area;

a first thin film transistor formed in the pixel display area, the first thin film transistor including a first gate insulating layer;

a second thin film transistor formed in the gate drive circuit area, the second thin film transistor including a second gate insulating layer;

wherein a thickness of the second gate insulating layer is smaller than a thickness of the first gate insulating layer.

In an exemplary implementation of this application, the base substrate further has a wiring area, and the array substrate further includes a transition structure formed in the wiring area, the transition structure including:

a third gate disposed in a same layer as a first gate of the first thin film transistor and a second gate of the second thin film transistor, and the third gate being connected to the second gate;

a third gate insulating layer disposed in a same layer as the first gate insulating layer and the second gate insulating layer, and the third gate insulating layer having a via hole to expose the third gate; and a transition line disposed in a same layer as a first source/drain of the first thin film transistor and a second source/drain of the second thin film transistor, the transition line being connected to the second source/drain, and one end of the transition line being located in the via hole and connected to the third gate.

In an exemplary implementation of this application, a ratio of the thickness of the second gate insulating layer to the thickness of the first gate insulating layer is 2:3 to 3:4.

In a second aspect of the present application, a manufacturing method of an array substrate is provided, including:

providing a base substrate, the base substrate having a pixel display area and a gate drive circuit area;

forming a first thin film transistor located in the pixel display area and a second thin film transistor located in the gate drive circuit area;

wherein the first thin film transistor includes a first gate insulating layer, the second thin film transistor includes a second gate insulating layer, and a thickness of the second gate insulating layer is smaller than a thickness of the first gate insulating layer.

In an exemplary embodiment of the present application, the base substrate further has a wiring area, wherein the manufacturing method includes:

forming a first gate of the first thin film transistor and a second gate of the second thin film transistor, and, meanwhile, forming a third gate located in the wiring area, the third gate being connected to the second gate; forming a gate insulating film covering the first gate, the second gate, and the third gate;

forming a photoresist layer covering the gate insulating film, and exposing and developing the photoresist layer using a gray-scale mask to form a photolithography pattern, wherein the photolithography pattern includes a first photolithography portion located in the pixel display area, a second photolithography portion located in the gate drive circuit area, a third photolithography portion located in the wiring area, a thickness of the second photolithography portion is smaller than a thickness of the first photolithography portion, and the third photolithography portion has a through hole aligned to the third gate;

removing the second photolithography portion and performing etching processing at a portion of the gate insulating film aligned to the gate drive circuit area and the through hole, to form the first gate insulating layer and the second gate insulating layer, and meanwhile, further form a third gate insulating layer covering a third gate layer, the third gate insulating layer having a via hole to expose the third gate layer;

forming a first active layer of the first thin film transistor on the first gate insulating layer and a second active layer of the second thin film transistor on the second gate insulating layer;

forming a first source/drain of the first thin film transistor on the first active layer and a second source/drain of the second thin film transistor on the second active layer, and meanwhile, further forming a transition line on the third gate insulating layer, the transition line being connected to the second source/drain, and one end of the transition line being located in the via hole and connected to the third gate.

In an exemplary embodiment of the present application, the removing the second photolithography portion and performing the etching processing at the portion of the gate insulating film aligned to the gate drive circuit area and the through hole, includes:

using reaction gas to simultaneously perform ashing processing on the second photolithography portion and dry etching processing at a portion of the gate insulating film aligned to the through hole, so as to remove the second photolithography portion and etch away a part of a thickness of the portion of the gate insulating film aligned to the through hole;

continuing to use the reaction gas to simultaneously perform the dry etching processing at a portion of the gate insulating film aligned to the second photolithography portion and the portion of the gate insulating film aligned to the through hole, etch away a part of a thickness of the portion of the gate insulating film aligned to the second photolithography portion, and completely etch away the portion of the gate insulating film aligned to the through hole, so as to form the first gate insulating layer, the second gate insulating layer, and the third gate insulating layer.

In an exemplary embodiment of the present application, the gate insulating film is made of one or more of silicon oxide, silicon nitride, and silicon oxynitride;

the photoresist layer is a positive photoresist;

the reaction gas includes sulfur hexafluoride and oxygen, and a flow ratio of the sulfur hexafluoride to the oxygen is 1:200 to 1:10.

In an exemplary embodiment of the present application, a flow rate of the sulfur hexafluoride is 100 sccm to 1000 sccm, and a flow rate of the oxygen is 10000 sccm to 20000 sccm.

In a third aspect of the present application, a display device is provided, including the array substrate according to any one of the above.

It should be understood that the above general description and the following detailed description are only exemplary and explanatory, and cannot limit the present application.

BRIEF DESCRIPTION OF THE DRAWINGS

The drawings herein are incorporated into the specification and constitute a part of the specification, show embodiments consistent with the application, and are used together with the specification to explain the principles of the application. Understandably, the drawings in the following description are only some embodiments of the present application. For those of ordinary skill in the art, without paying any creative work, other drawings may be obtained based on these drawings.

DETAILED DESCRIPTION

Figure 1:
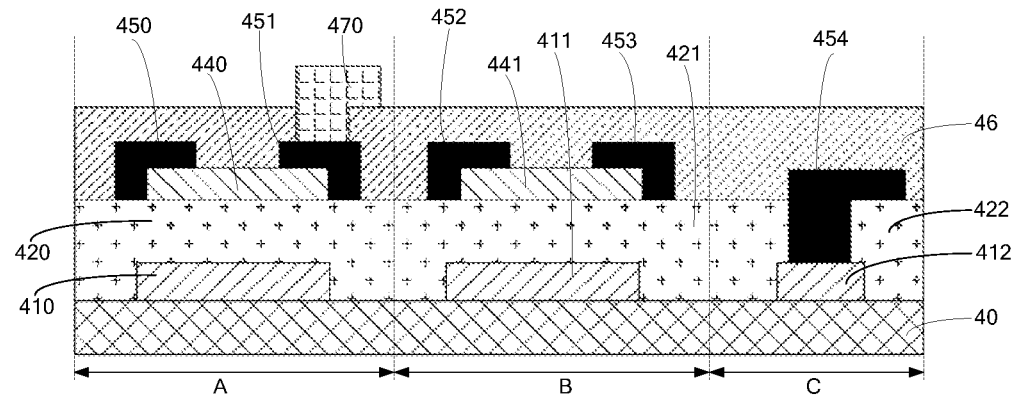
FIG. 1 shows a schematic structural diagram of an array substrate in the related art.

Example embodiments will now be described more fully with reference to the drawings. However, the example embodiments may be implemented in various forms and should not be construed as being limited to the embodiments set forth herein; rather, these embodiments are provided so that this application will be comprehensive and complete, and the concept of example embodiments will be fully communicated to those skilled in the art. The same reference numerals in the drawings denote the same or similar structures, and thus their detailed description will be omitted.

Although relative terms are used in this specification, such as "up" and "down", to describe the relative relationship between one component of an icon and another component, however, these terms are used in this specification for convenience only, for example, according to the directions of the examples described in the drawings. It may be understood that if the icon device is turned upside down, the component described as "up" will become the component as "down." When a structure is "on" another structure, it may mean that the structure is integrally formed on the other structure, or that the structure is "directly" arranged on the other structure, or that the structure is arranged "indirectly" on the other structure through another structure.

Figure 2:
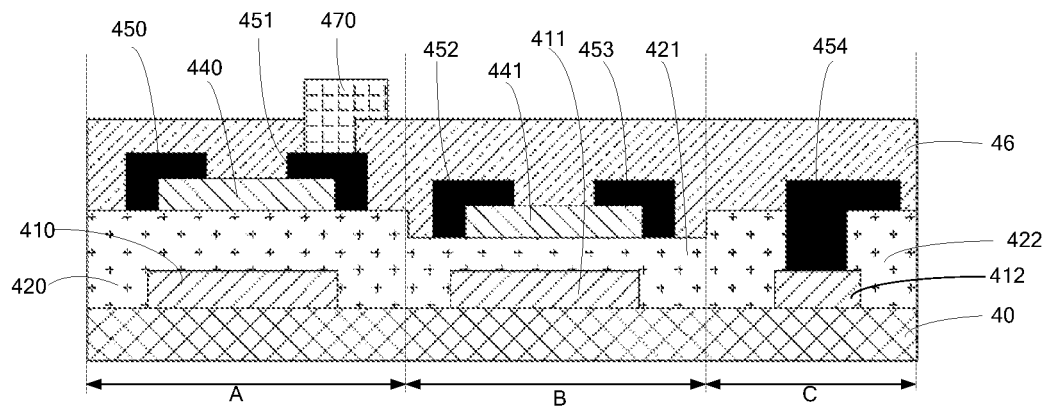
FIG. 2 shows a schematic structural diagram of an array substrate according to an embodiment of the present application.

An embodiment of the present application provides an array substrate, as shown in FIGS. 1 and 2, which includes a base substrate 40, a first thin film transistor, and a second thin film transistor, wherein:

the base substrate 40 may have a pixel display area A and a gate drive circuit area B. For example, the base substrate 40 may be a single-layer structure, such as a glass substrate, but is not limited thereto. The base substrate 40 may also be a multi-layer structure, that is, in addition to the glass substrate, it may also include structures such as a buffer layer on the glass substrate.

The first thin film transistor is formed in the pixel display area A, and it should be understood that a plurality of first thin film transistors may be formed in the pixel display area A. In detail, the first thin film transistor may include a first gate 410, a first active layer 440, a first source/drain, and a first gate insulating layer 420, the first source/drain being connected to the first active layer 440, that is, a first source 450 and a first drain 451 of the first source/drain are respectively connected to the first active layer 440; and the first gate insulating layer 420 may be formed between the first gate 410 and the first active layer 440. For example, the first gate 410, the first source 450, and the first drain 451 may be made of metal materials, such as copper, etc., but not limited to this, it may also be aluminum, molybdenum, chromium, tungsten, titanium, tantalum, and alloys containing them, and the materials are not specifically limited here. The first active layer 440 may be made of an oxide semiconductor material, for example, indium gallium zinc oxide (IGZO), etc., or one or more of aluminum zinc oxide (AZO), indium zinc oxide (IZO), zinc oxide (ZnO), indium oxide (In2O3), boron-doped zinc oxide (BZO), and magnesium-doped zinc oxide (MZO). The first gate insulating layer 420 may be made of one or more of silicon oxide, silicon nitride, and silicon oxynitride, but is not limited thereto.

The second thin film transistor is formed in the gate drive circuit area B. It should be understood that a plurality of second thin film transistors may be formed in the gate drive circuit area B. In detail, the second thin film transistor may include a second gate 411, a second active layer 441, a second source/drain, and a second gate insulating layer 421, the second source/drain being connected to the second active layer 441, that is, a second source 452 and a second drain 453 of the second source/drain are respectively connected to the second active layer 441. Further, the second gate insulating layer 421 may be formed between the second gate 411 and the second active layer 441. For example, the second gate 411, the second source 452, and the second drain 453 may be made of metal materials, such as copper, etc., but not limited to this, it may also be aluminum, molybdenum, chromium, tungsten, Titanium, tantalum, and alloys containing them, and the materials are not specifically limited here. The second active layer 441 may be made of an oxide semiconductor material, for example, indium gallium zinc oxide (IGZO), etc., or one or more of aluminum zinc oxide (AZO), indium zinc oxide (IZO), zinc oxide (ZnO), indium oxide (In2O3), boron-doped zinc oxide (BZO), and magnesium-doped zinc oxide (MZO). The second gate insulating layer 421 may be made of one or more of silicon oxide, silicon nitride, and silicon oxynitride, but is not limited thereto.

It should be understood that, in order to simplify the manufacturing steps of the array substrate, the first thin film transistor and the second transistor of this embodiment may be disposed in the same layer, that is: the first gate 410 and the second gate 411 may be disposed in the same layer, the first active layer 440 and the second active layer 441 may be disposed in the same layer, the first source/drain and the second source/drain may be disposed in the same layer, and the first gate insulating layer 420 and the second gate insulating layer 421 may be disposed in the same layer.

In addition, it should be noted that the disposed in the same layer mentioned in this application refers to the same material and is formed by using one patterning process.

In an embodiment, as shown in FIG. 2, a thickness of the second gate insulating layer 421 of the second thin film transistor may be smaller than a thickness of the first gate insulating layer 420 of the first thin film transistor.

By making the thickness of the gate insulating layer of the second thin film transistor in the gate drive circuit area B smaller than the thickness of the gate insulating layer of the first thin film transistor in the pixel display area A, and compared to the scheme in the related art where the thickness of the second gate insulating layer 421 of the second thin film transistor in the gate drive circuit area B is equal to the thickness of the first gate insulating layer 420 of the first thin film transistor in the pixel display area A, referring to FIG. 1, a capacitance generated between the first gate 410 and the first active layer 440 in the second thin film transistor may be caused to be larger than a capacitance generated between the second gate 411 and the second active layer 441 in the first thin film transistor.

according to the following equation:

$$I = \frac{W}{2 \times L} \times \mu \times C_1 \times (V_G - V_{th})^2;$$

where, I is an output current, W is a width of a thin film transistor, L is a channel length of the thin film transistor, μ is a carrier mobility, $C_1$ is a voltage between a gate and an active layer, $V_G$ is a gate voltage, and $V_{th}$ is a threshold voltage.

Under a condition of the same change amount of I, the larger the $C_1$, the smaller the corresponding amount of change of $V_G$, so that a sub-threshold swing is smaller. The threshold swing is a performance indicator that measures a mutual conversion rate between turn-on and turn-off states of a transistor, which represents the amount of change in gate voltage required to change a source-drain current ten times, also known as a factor S. A smaller S means faster turn-on and turn-off rates.

In summary, in this embodiment, since the capacitance generated between the first gate 410 and the first active layer 440 in the second thin film transistor is larger than the capacitance generated between the second gate 411 and the second active layer 441 in the first thin film transistor, the subthreshold swing of the second thin film transistor is caused to be smaller than the subthreshold swing of the first thin film transistor. Since the subthreshold swing of the second thin film transistor in the gate drive circuit area B is relatively smaller, the second thin film transistor may be turned on faster. Since the subthreshold swing of the first thin film transistor in the pixel display area A is relatively larger, a voltage change of the first thin film transistor may be delayed to enhance the display brightness. In other words, in this embodiment, the thickness of the gate insulating layer may be improved for the functions of different functional areas, so as to further improve the overall display effect.

Optionally, a ratio of the thickness of the second gate insulating layer 421 to the thickness of the first gate insulating layer 420 is 2:3 to 3:4. On the one hand, it may avoid a situation that a thickness difference between the first gate insulating layer 420 and the second gate insulating layer 421 is too large, resulting in increased difficulty in manufacturing; on the other hand, it may avoid a situation that the thickness difference between the first gate insulating layer 420 and the second gate insulating layer 421 is too small to meet the performance requirements of the first thin film transistor and the second thin film transistor. For example, the thickness of the first gate insulating layer 420 may be 4000 Å (Angstrom), and the thickness of the second gate insulating layer 421 may be 3000 Å, but it is not limited thereto, and the thicknesses between the first gate insulating layer 420 and the second gate insulating layer 421 may be adjusted according to specific operating conditions.

The first thin film transistor and the second thin film transistor may be bottom-gate thin film transistors, that is, a gate is located on a side of an active layer facing to the base substrate 40; or may be top-gate thin film transistors, that is, the gate is located on a side of the active layer facing away from the base substrate 40. If the first thin film transistor and the second thin film transistor in this embodiment are the top-gate thin film transistors, in addition to the aforementioned gate, active layer, source/drain, gate insulating layer, etc., an interlayer dielectric layer between the gate and the source/drain is usually needed to be included. The source/drain may be sequentially connected to the active layer passing through the interlayer dielectric layer and the gate insulating layer, the bottom-gate thin film transistors may not require the interlayer dielectric layer, and the source/drain may also be connected to the active layer without passing through the gate insulating layer.

From this, compared with the top-gate thin-film transistors, the bottom-gate thin-film transistors are simple to manufacture and thinner. Therefore, in this embodiment, the first thin-film transistor and the second thin-film transistor are preferably bottom-gate thin-film transistors; that is, the first gate 410, the first gate insulating layer 420, the first active layer 440, and the first source/drain in the first thin film transistor are sequentially stacked and formed in the pixel display area A; the second gate 411, the second gate insulating layer 421, the second active layer 441, and the second source/drain in the second thin film transistor are sequentially stacked and formed in the gate drive circuit area B.

In this embodiment, the base substrate 40 may include not only the foregoing pixel display area A and gate drive circuit area B, but also a wiring area C, which may be located on a side of the gate drive circuit area B away from the pixel display area A, and have a transition structure, configured to implement that the first thin film transistor in the pixel display area A or the second thin film transistor in the gate drive circuit area B is connected to other structures. In detail, the transition structure includes a third gate 412, a third gate insulating layer 422 and an transition line 454, for example, the third gate 412 and the transition line 454 may be made of metal materials, such as copper, etc.; the third gate insulating layer 422 may be made of one or more of silicon oxide, silicon nitride, and silicon oxynitride, but is not limited thereto.

It should be understood that, to simplify the manufacturing steps of the array substrate, the third gate 412 may be disposed in the same layer as the first gate 410 and the second gate 411; the third gate insulating layer 422 may be disposed in the same layer as the first gate insulating layer 420 and the second gate insulating layer 421, wherein the third gate insulating layer 422 may have a via hole 423 to expose the third gate 412, and for example, the thickness of the third gate insulating layer 422 may be the same as the thickness of the first gate insulating layer 420; the transition line 454 may be disposed in the same layer as the first source/drain and the second source/drain, and one end of the transition line 454 is located in the via hole 423 and connected to the third gate 412.

The transition line 454 in this embodiment may be connected to the second source/drain, specifically to the second source 452, and the third gate 412 may be connected to the second gate 411 of the second thin film transistor. In this way, the transition line 454 may transmit a received signal to the second gate 411 and the second source 452 of the second thin film transistor, so that the second thin film transistor may be turned on under this signal and transmit the signal to a next node.

It should be noted that the array substrate not only includes the aforementioned first thin film transistor, second thin film transistor and transition structure, but also includes a flat layer 46 and a pixel electrode layer 470, wherein the flat layer 46 is formed on the base substrate 40 and covers the first source/drain, the second source/drain, and the transition structure, and meanwhile, the flat layer 46 also covers the first gate insulating layer 420, the second gate insulating layer 421, and the third gate insulating layer 422; the pixel electrode layer 470 may be connected to the first drain 451 of the first thin film transistor through the flat layer 46.

The embodiments of the present application also provide a manufacturing method of an array substrate. The array substrate is the array substrate described in any one of the foregoing embodiments. Since the foregoing embodiments have described the structure of the array substrate in detail, the structure of the array substrate will not be described in detail below, but only the manufacturing method of the array substrate.

Figure 3:
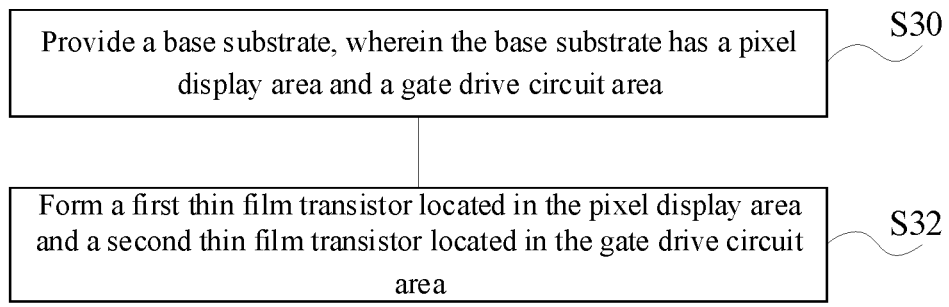
FIG. 3 shows a flowchart of a manufacturing method of the array substrate shown in FIG. 2.

As shown in FIG. 3, the manufacturing method of the array substrate may include:

Step S30, providing a base substrate, wherein the base substrate may have a pixel display area and a gate drive circuit area;

Step S32, forming a first thin film transistor located in the pixel display area and a second thin film transistor located in the gate drive circuit area;

wherein, as shown in FIG. 2, the first thin film transistor includes the first gate insulating layer 420, and the second thin film transistor includes the second gate insulating layer 421, and a thickness of the second gate insulating layer 421 is smaller than a thickness of the first gate insulating layer 420.

Specifically, Step S32 may include Step S320, Step S322, Step S324, and Step S326, wherein:

in Step S320, the first gate 410 located in the pixel display area A and the second gate 411 located in the gate drive circuit area B are formed.

Figure 8:
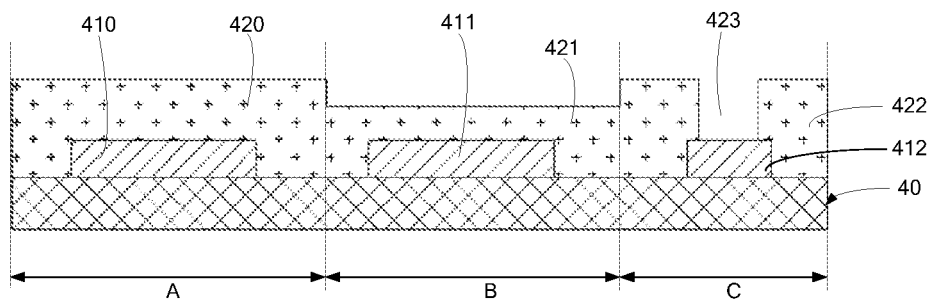
FIG. 8 shows a schematic structural diagram after completing a third stage in Step S3224.

In Step S322, the first gate insulating layer 420 covering the first gate 410 and the second gate insulating layer 421 covering the second gate 411 are formed, as shown in FIG. 8.

In Step S324, the first active layer 440 on the first gate insulating layer 420 and the second active layer 441 on the second gate insulating layer 421 are formed, as shown in FIG. 2; specifically, a semiconductor thin film layer may be formed on the base substrate 40 by any one of various methods such as chemical vapor deposition, coating, sputtering, etc., and the semiconductor thin film layer may cover the first gate insulating layer 420 and the second gate insulating layer 421; then, a one-time patterning process on the semiconductor thin film layer once may be performed to form the first active layer 440 on the first gate insulating layer 420 and the second active layer 441 on the second gate insulating layer 421; the one-time patterning process mentioned in this embodiment may include: photoresist coating, exposure, development, etching, and photoresist stripping.

In Step S326, a first source/drain on the first active layer 440 and a second source/drain on the second active layer 441 are formed, as shown in FIG. 2.

It should be noted that when the base substrate 40 further has a wiring area C, in this embodiment, while forming the first thin film transistor located in the pixel display area A and the second thin film transistor located in the gate drive circuit area B, a transition structure located in the wiring area C is formed, and details are as follows:

in Step S320, while forming the first gate 410 in the pixel display area A and the second gate 411 in the gate drive circuit area B, the third gate 412 in the wiring area C may also be formed, and the third gate 412 is connected to the second gate 411.

In detail, the gate thin film layer may be formed on the base substrate 40 by any of various methods such as chemical vapor deposition, coating, sputtering, etc., and then a one-time patterning process is performed on the gate thin film layer to form the first gate 410 in the pixel display area A, the second gate 411 in the gate drive circuit area B, and the third gate 412 in the wiring area C.

It should be noted that the one-time patterning process in this embodiment may include photoresist coating, exposure, development, etching, and photoresist stripping.

In step S322, while forming the first gate insulating layer 420 covering the first gate 410 and the second gate insulating layer 421 covering the second gate 411, the third gate insulating layer 422 covering the third gate 412 may also be formed. The third gate insulating layer 422 has the via hole 423 to expose the third gate 412, as shown in FIG. 8.

In detail, in Step S322, it may specifically include Step S3220, Step S3222, and Step S3224.

Figure 4:
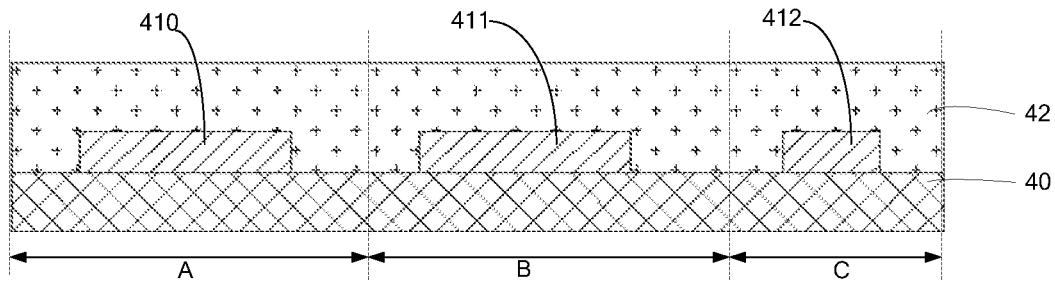
FIG. 4 shows a schematic structural diagram after completing Step S3220.

In Step S3220, a gate insulating film 42 is formed on the base substrate 40, and the gate insulating film 42 may cover the first gate 410, the second gate 411, and the third gate 412. For example, the gate insulating film 42 layer may be formed on the base substrate 40 by any of various methods such as chemical vapor deposition, coating, sputtering, etc., as shown in FIG. 4.

Figure 5:
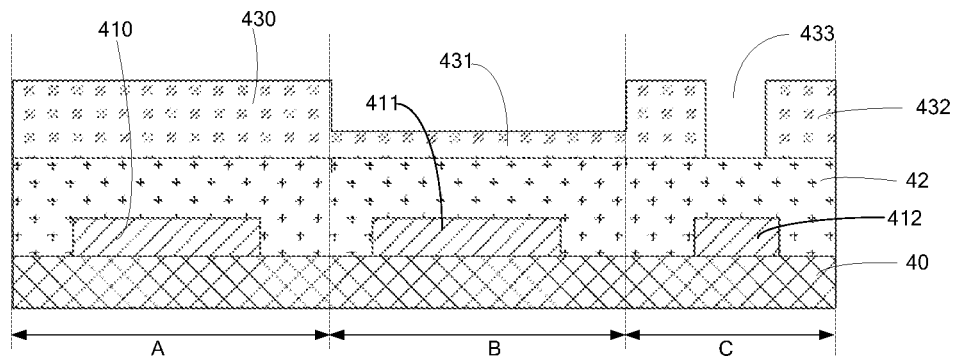
FIG. 5 shows a schematic structural diagram after completing Step S3222.

In Step S3222, a photoresist layer is formed on the gate insulating film 42, and the photoresist layer is exposed and developed using a gray-scale mask to form a photolithography pattern, as shown in FIG. 5. The photolithography pattern includes a first photolithography portion 430 located in the pixel display area A, a second photolithography portion 431 located in the gate drive circuit area B, and a third photolithography portion 432 located in the wiring area C. A thickness of the second photolithography portion 431 is smaller than a thickness of the first photolithography portion 430, and the third photolithography portion 432 has a through hole 433 aligned to a position where the third gate 412 is to be formed with a via hole.

For example, in order to form this photolithography pattern, the gray-scale mask may include a first area, a second area, and a third area with different light transmittances. The first area corresponds to the pixel display area A, the light transmittance of this first area may be 0%, that is, the first area may be an non-exposure area for forming the first photolithography portion 430, and the thickness of the first photolithography portion 430 is 18000 Å to 25000 Å, but it is not limited thereto. The second area corresponds to the gate drive circuit area B, and the light transmittance of this second area may be 10% to 80%, that is, the second area may be a half-exposure area for forming the second photolithography portion 431 with a thickness smaller than that of the first photolithography portion 430, and the thickness of the second photolithography portion 431 may be 3000 Å to 7000 Å; the third area corresponds to the wiring area C, the local light transmittance of this third area is 100%, and the light transmittance of other parts is 0%, that is, the third area may include a full-exposure area and the non-exposure area for forming the third photolithography portion 432 having the through hole 433, and the thickness of the third photolithography portion 432 may be the same as that of the first photolithography portion 430. It should be understood that the full-exposure area is where the through hole 433 is formed.

In Step S3224, the second photolithography portion 431 is removed and a portion of the gate insulating film 42 aligned to the gate drive circuit area B and the through hole 433 is performed etching processing to form the first gate insulating layer 420, the second gate insulating layer 421 and the third gate insulating layer 422, as shown in FIG. 8.

Figure 6:
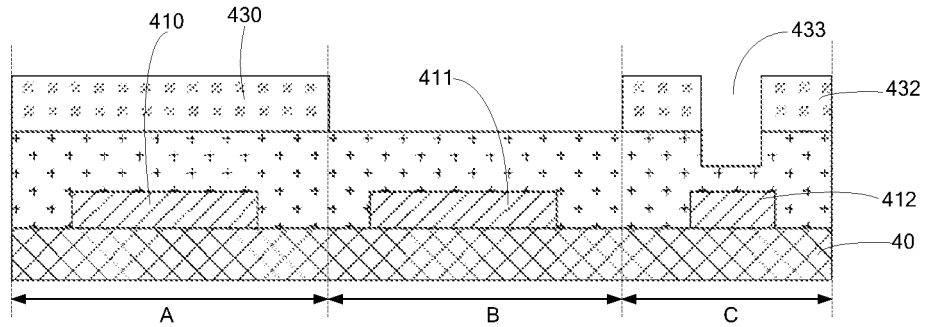
FIG. 6 shows a schematic structural diagram after completing a first stage in Step S3224.
Figure 7:
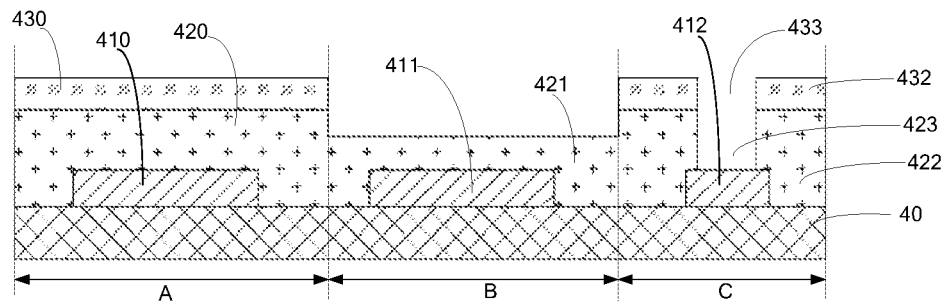
FIG. 7 shows a schematic structural diagram after completing a second stage in Step S3224.

For example, the Step S3224 may include two stages: in a first stage, reaction gas may be used to simultaneously perform ashing processing on the second photolithography portion 431 and dry etching processing at a portion of the gate insulating film 42 aligned to the through hole 433, in other words, the reaction gas may etch the portion of the gate insulating film 42 aligned to the through hole 433 while ashing the second photolithography portion 431, so as to remove the second photolithography portion 431 and etch away a part of the thickness of the portion of the gate insulating film 42 aligned to the through hole 433. In this case, the thickness of the photoresist of the first photolithography portion 430 and the third photolithography portion 432 except for the through hole will also be reduced a part by the ashing processing, as shown in FIG. 6, where the first stage may take 0.5 minutes to 1 minute, but not limited to this; in a second stage, this reaction gas is continued to be used to simultaneously perform dry etching processing on a portion of the gate insulating film 42 aligned to the second photolithography portion 431 and the portion of the gate insulating film 42 aligned to the through hole 433, so as to etch away a part of the thickness of the portion of the gate insulating film 42 aligned to the second photolithography portion 431 and completely etch away the portion of the gate insulating film 42 aligned to the through hole 433 (i.e., the via hole 423 is formed), as shown in FIG. 7, for forming the first gate insulating layer 420, the second gate insulating layer 421, and the third gate insulating layer 422, wherein the second stage may take 0.5 minutes to 1 minute, but is not limited to this.

Optionally, when the gate insulating film 42 is made of one or more of silicon oxide, silicon nitride, and silicon oxynitride, and the photoresist is a positive photoresist, the reaction gas may include sulfur hexafluoride and oxygen. A flow ratio of sulfur hexafluoride to oxygen may be 1:200 to 1:10, for example: 1:200, 1:100, 1:10, 1:50, but not limited to this, depending on a specific situation. Alternatively, a flow rate of sulfur hexafluoride may be 100 sccm to 1000 sccm, such as: 100 sccm, 500 sccm, 1000 sccm; a flow rate of oxygen may be 10000 sccm to 20000 sccm, such as: 10000 sccm, 15000 sccm, 20000 sccm.

In addition, in addition to the aforementioned first stage and second stage, this Step S3224 may also include a third stage after the second stage. This third stage is to peel off the first photolithography portion 430 remaining on the first gate insulating layer 420 and the third photolithography portion 432 remaining on the third gate insulating layer 422, as shown in FIG. 8.

In Step S326, while forming the first source/drain on the first active layer 440 and the second source/drain on the second active layer 441, a transition line 454 on the third gate insulating layer 422 is also formed, the transition line 454 is connected to the second source/drain, and one end of the transition line 454 is located in the via hole 423 and connected to the third gate 412 to form a transition structure, as shown in FIG. 2.

In detail, a source-drain thin film layer may be form on the base substrate 40 by any one of various methods such as chemical vapor deposition, coating, sputtering, etc. This source-drain thin film layer may cover the first active layer 440 and the second active layer 441. It should be understood that the source-drain thin film layer may also simultaneously cover the first gate insulating layer 420, the second gate insulating layer 421, and the third gate insulating layer 422; then a one-time patterning process is performed on the source-drain thin film layer to form the first source/drain on the first active layer 440, the second source/drain on the second active layer 441, and the transition line 454 on the third gate insulating layer 422, and one end of the transition wire 454 is located in the via hole 423 and connected to the third gate 412. The one-time patterning process mentioned in this embodiment may include photoresist coating, exposure, development, etching, and photoresist stripping.

After Step S32, the manufacturing method of the array substrate may include Step S34 and Step S36.

In step S34, a flat layer 46 is formed on the base substrate 40. The flat layer 46 covers the first source/drain, the second source/drain, and the transition structure. Meanwhile, the flat layer 46 also covers the first gate insulating layer 420, the second gate insulating layer 421 and the third gate insulating layer 422. It should be understood that, in order to facilitate subsequent connection between the pixel electrode layer 470 and the first drain 451 of the first thin film transistor, the flat layer 46 may have a through hole through which one end of the pixel electrode layer 470 passes. For example, the flat layer 46 may be formed on the base substrate 40 by any one of various methods such as chemical vapor deposition, coating, sputtering, etc., and then the one-time patterning process may be performed on the flat layer 46 to form a through hole. The one-time patterning process mentioned in this embodiment may include photoresist coating, exposure, development, etching, and photoresist stripping.

In Step S34, the pixel electrode layer 470 is formed on the flat layer 46, and this pixel electrode layer 470 may be connected to the first drain 451 of the first thin film transistor through the flat layer 46, as shown in FIG. 2. For example, the pixel electrode film may be formed on the flat surface by any one of various methods such as chemical vapor deposition, coating, sputtering, and then a patterning process is performed on the pixel electrode film to form the pixel electrode layer 470. The patterning process mentioned in this embodiment may include photoresist coating, exposure, development, etching, and photoresist stripping.

An embodiment of the present application further provides a display device, which includes the aforementioned array substrate. According to the embodiment of the present application, the specific type of the display device is not particularly limited, and the types of display devices commonly used in the art may be used, such as mobile devices such as LCD displays, OLED displays, mobile phones, wearable devices such as watches, VR devices, etc. A person skilled in the art may make a corresponding selection according to the specific use of the display device, which will not be repeated here.

It should be noted that in addition to the array substrate, the display device includes other necessary components and components. Taking the display as an example, specific examples include a case, a circuit board, a power cord, etc. The specific use requirements of the device will be supplemented accordingly and will not be repeated here.

The technical solution provided by this application may achieve the following beneficial effects:

the array substrate, the manufacturing method of the array substrate and the display device provided by the present application, by making the thickness of the gate insulating layer of the second thin film transistor in the gate drive circuit area smaller than the thickness of the gate insulating layer of the first thin film transistor in the pixel display area, may make a capacitance of the second thin film transistor larger than a capacitance of the first thin film transistor, so as to make a subthreshold swing of the second thin film transistor smaller than a subthreshold swing of the first thin film transistor; since the subthreshold swing of the second thin film transistor in the gate drive circuit area is relatively smaller, the second thin film transistor may be turned on faster; since the subthreshold swing of the first thin film transistor in the pixel display area is relatively larger, voltage variation of the first thin film transistor may be delayed to enhance\gray scale display effect; in other words, the present application may improve the thickness of the gate insulating layer according to functions of different functional areas, so as to further improve the overall display effect.

The terms "a," "an," "the," "said," etc., are used to indicate the presence of one or more elements, components, etc. The terms "including" and "having" are intended to mean an open-ended inclusion and mean that there may be additional elements, components, etc. in addition to the listed elements, components, etc. The terms "first," "second," etc. are only used as markers or labels, not to limit the number of objects.

After considering the description and practicing the invention disclosed herein, those skilled in the art will easily think of other embodiments of the present application. This application is intended to cover any variations, uses, or adaptations of this application, which follow the general principles of this application and include common general knowledge or customary technical means in the technical field not disclosed in this application. The description and examples are to be considered exemplary only, and the true scope and spirit of this application are pointed out by the appended claims.

What is claimed is:

1. A manufacturing method of an array substrate, comprising:

providing a base substrate, the base substrate having a pixel display area and a gate drive circuit area; and forming a first thin film transistor located in the pixel display area and a second thin film transistor located in the gate drive circuit area by:

forming a first gate of the first thin film transistor and a second gate of the second thin film transistor;

forming a photoresist layer covering the gate insulating film, and exposing and developing the photoresist layer using a gray-scale mask to form a photolithography pattern, wherein, the photolithography pattern comprises a first photolithography portion located in the pixel display area, a second photolithography portion located in the gate drive circuit area, and a thickness of the second photolithography portion is smaller than a thickness of the first photolithography portion;

removing the second photolithography portion and performing etching processing at a portion of the gate insulating film aligned to the gate drive circuit area, to form a first gate insulating layer and a second gate insulating layer;

forming a first active layer of the first thin film transistor on the first gate insulating layer and a second active layer of the second thin film transistor on the second gate insulating layer; and forming a first source/drain of the first thin film transistor on the first active layer and a second source/drain of the second thin film transistor on the second active layer;

wherein the first thin film transistor comprises the first gate insulating layer, the second thin film transistor comprises the second gate insulating layer, and a thickness of the second gate insulating layer is smaller than a thickness of the first gate insulating layer.

2. The manufacturing method according to claim 1, wherein removing the second photolithography portion and performing the etching processing at the portion of the gate insulating film aligned to the gate drive circuit area, comprises:

using reaction gas to perform ashing processing on the second photolithography portion, to remove the second photolithography portion; and continuing to use the reaction gas to perform the dry etching processing at a portion of the gate insulating film aligned to the second photolithography portion, to etch away a part of a thickness of the portion of the gate insulating film aligned to the second photolithography portion, to form the first gate insulating layer and the second gate insulating layer.

3. The manufacturing method according to claim 2, wherein:

the gate insulating film is made of one or more of silicon oxide, silicon nitride, and silicon oxynitride;

the photoresist layer is a positive photoresist; and the reaction gas comprises sulfur hexafluoride and oxygen, and a flow ratio of the sulfur hexafluoride to the oxygen is 1:200 to 1:10.

4. The manufacturing method according to claim 2, wherein a flow rate of the sulfur hexafluoride is 100 sccm to 1000 sccm, and a flow rate of the oxygen is 10000 sccm to 20000 sccm.

5. A manufacturing method for manufacturing an array substrate, comprising:

providing a base substrate, the base substrate having a pixel display area and a gate drive circuit area;

forming a first thin film transistor located in the pixel display area and a second thin film transistor located in the gate drive circuit area, wherein the first thin film transistor comprises a first gate insulating layer, the second thin film transistor comprises a second gate insulating layer, and a thickness of the second gate insulating layer is smaller than a thickness of the first gate insulating layer, and wherein the base substrate further comprises a wiring area;

forming a first gate of the first thin film transistor and a second gate of the second thin film transistor, and meanwhile, further forming a third gate located in the wiring area, the third gate being connected to the second gate; and forming a gate insulating film covering the first gate, the second gate, and the third gate;

forming a photoresist layer covering the gate insulating film, and exposing and developing the photoresist layer using a gray-scale mask to form a photolithography pattern, wherein, the photolithography pattern comprises a first photolithography portion located in the pixel display area, a second photolithography portion located in the gate drive circuit area, and a third photolithography portion located in the wiring area, a thickness of the second photolithography portion is smaller than a thickness of the first photolithography portion, and the third photolithography portion has a through hole aligned to the third gate;

removing the second photolithography portion and performing etching processing at a portion of the gate insulating film aligned to the gate drive circuit area and the through hole, to form the first gate insulating layer and the second gate insulating layer, and meanwhile, further form a third gate insulating layer covering a third gate, the third gate insulating layer having a via hole to expose the third gate;

forming a first active layer of the first thin film transistor on the first gate insulating layer and a second active layer of the second thin film transistor on the second gate insulating layer; and forming a first source/drain of the first thin film transistor on the first active layer and a second source/drain of the second thin film transistor on the second active layer, and meanwhile, further forming a transition line on the third gate insulating layer, the transition line being connected to the second source/drain, and one end of the transition line being located in the via hole and connected to the third gate.

6. The manufacturing method according to claim 5, wherein removing the second photolithography portion and performing the etching processing at the portion of the gate insulating film aligned to the gate drive circuit area and the through hole further comprises:

using reaction gas to simultaneously perform ashing processing on the second photolithography portion and dry etching processing at a portion of the gate insulating film aligned to the through hole, to remove the second photolithography portion and etch away a part of a thickness of the portion of the gate insulating film aligned to the through hole; and continuing to use the reaction gas to simultaneously perform the dry etching processing at a portion of the gate insulating film aligned to the second photolithography portion and the portion of the gate insulating film aligned to the through hole, to etch away a part of a thickness of the portion of the gate insulating film aligned to the second photolithography portion, and completely etch away the portion of the gate insulating film aligned to the through hole, to form the first gate insulating layer, the second gate insulating layer, and the third gate insulating layer.

7. The manufacturing method according to claim 6, wherein:

the gate insulating film is made of one or more of silicon oxide, silicon nitride, and silicon oxynitride;

the photoresist layer is a positive photoresist; and the reaction gas comprises sulfur hexafluoride and oxygen, and a flow ratio of the sulfur hexafluoride to the oxygen is 1:200 to 1:10.

8. The manufacturing method according to claim 7, wherein a flow rate of the sulfur hexafluoride is 100 sccm to 1000 sccm, and a flow rate of the oxygen is 10000 sccm to 20000 sccm.

* * * * *